(12) United States Patent
Watanabe et al.

(10) Patent No.: US 7,809,920 B2
(45) Date of Patent: Oct. 5, 2010

(54) INFORMATION PROCESSOR WITH MEMORY DEFECT REPAIR

(75) Inventors: Takao Watanabe, Fuchu (JP);
Motokazu Ozawa, Moriguchi (JP);
Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 905 days.

(21) Appl. No.: 11/703,762

(22) Filed: Feb. 8, 2007

(65) Prior Publication Data

US 2007/0226405 A1     Sep. 27, 2007

(30) Foreign Application Priority Data

Feb. 10, 2006   (JP)   ............... 2006-033630

(51) Int. Cl.
*G06F 12/02*   (2006.01)
(52) U.S. Cl. ............ 711/202; 711/3; 711/105; 711/E12.014; 714/8
(58) Field of Classification Search ............ None
See application file for complete search history.

(56) References Cited

U.S. PATENT DOCUMENTS 5,598,373 A    1/1997   Wada et al. ............ 365/230.03
6,192,486 B1 * 2/2001   Correale et al. ............... 714/8
6,205,065 B1   3/2001   Sugibayashi ............... 365/200
6,412,044 B1 * 6/2002   Kung ...................... 711/133
7,023,747 B2   4/2006   Takahashi .................. 365/200

FOREIGN PATENT DOCUMENTS

JP          8-16486       1/1996
JP          2000-285695   10/2000
WO          WO 02/45093   6/2002

* cited by examiner

*Primary Examiner*—Kevin Verbrugge
*Assistant Examiner*—Eric Loonan
(74) *Attorney, Agent, or Firm*—Miles & Stockbridge P.C.

(57) ABSTRACT

In an information processor including memory devices such as DRAMs and others, by reducing the power consumption of memory devices and efficiently repairing defect bits, a highly reliable information processor is realized. In an information processor including an external memory such as a DRAM, a second memory whose power consumption at the access time is smaller than that of the external memory is disposed, and cache data of the external memory and repair data are stored in this second memory. To an input address given from a central processing unit via a primary cache controller, a memory controller determines a hit or a miss with reference to a tag memory for cache and a tag memory for repair, and when one or both of tag memory for cache and a tag memory for repair are hit, it accesses the second memory.

11 Claims, 6 Drawing Sheets

| MEMORY NAME | ADDRESS | CONTENTS |
|---|---|---|
| TM1 | INDEX1 | FLAG1,TAG1 |
| M1 | INDEX1 | DATA-M1 |
| TM2-1 | INDEX2-1 | FLAG2-1,TAG2-1,ADD-M2 |
| TM2-2 | INDEX2-2 | FLAG2-2,TAG2-2,ADD-M2 |
| M2 | ADD-M2 | DATA-M2 |

FIG. 3

| CASE NUMBER | ADDRESS COMPARISON RESULT | MEMORY TO READ DATA | MEMORY CONTROL OF OTHER THAN ACCESS OBJECT |
|---|---|---|---|
| 1 | TM1 : HIT | M1 | |
| 2 | TM1,TM2-1,TM2-2 : MISS | M3 | TAG1→INDEX1 : TM1<br>TAG2-1,ADD-M2→INDEX2-1 : TM2-1<br>DATA-M3→INDEX1 : M1<br>DATA-M3→ADD-M2 : M2 |
| 3 | TM1 : MISS<br>TM2-1,TM2-2 : HIT | M2 | TAG1→INDEX1 : TM1<br>DATA-M2→INDEX1 : M1 |
| 4 | TM1,TM2-2 : MISS<br>TM2-1 : HIT | M2 | TAG1→INDEX1 : TM1<br>DATA-M2→INDEX1 : M1 |
| 5 | TM1,TM2-1 : MISS<br>TM2-2 : HIT | M2 | TAG1→INDEX1 : TM1<br>TAG2-1,ADD-M2→INDEX2-1 : TM2-1<br>DATA-M2→INDEX1 : M1 |

| MEMORY NAME | ADDRESS | CONTENTS |
|---|---|---|
| TM2-1r | INDEX2-1r | FLAG2-1,TAG2-1r,INDEX2-1c |
| TM2-1c | INDEX2-1c | TAG2-1c,ADD-M2 |
| TM2-2r | INDEX2-2r | FLAG2-2,TAG2-2r,INDEX2-2c |
| TM2-2c | INDEX2-2c | TAG2-2c,ADD-M2 |
| M2 | ADD-M2 | DATA |

INFORMATION PROCESSOR WITH MEMORY DEFECT REPAIR

CROSS-REFERENCE TO RELATED APPLICATION

The present application claims priority from Japanese Patent Application No. JP 2006-033630 filed on Feb. 10, 2006, the content of which is hereby incorporated by reference into this application.

TECHNICAL FIELD OF THE INVENTION

The present invention relates to an information processor. More particularly, it relates to the improvement in reliability of memory devices which form an information processor.

BACKGROUND OF THE INVENTION

As a memory device which forms an information processor, a dynamic random access memory (hereinafter, referred to as DRAM) has been used widely. As a technology for improving the reliability of the DRAM, a method for repairing defect bits is described in, for example, the following documents.

In the method disclosed in Japanese Patent Application Laid-Open Publication No. 2000-285695 (Patent document 1), defect bits are repaired in units of bit by substituting data of cells in an SRAM array on the same chip for data of cells of pose defects in a DRAM. In the method disclosed in Japanese Patent Application Laid-Open Publication No. 8-16486 (Patent document 2), an exclusive chip for repairing defect bits of a DRAM is provided in a DRAM module formed of a plurality of DRAM chips, and data is substituted in units of logic word line of the DRAM chip. In the method disclosed in a pamphlet of International Publication No. WO 02/45093 (Patent document 3), an SRAM is mounted in a DRAM chip, and normal word lines in the SRAM are substituted for a defect word line of the DRAM or that of the SRAM itself.

SUMMARY OF THE INVENTION

In the respective conventional technologies mentioned above, methods for repairing defect bits of DRAMs are described. However, these methods are insufficient for the prevention of retention defects at high temperature. The retention characteristics of the DRAM are generally sensitive to temperature increases, and the number of defect bits increases rapidly when the chip temperature increases about 10° C. to 20° C. The junction temperature Tj of the DRAM is the sum of the temperature Ta of ambient environment where the DRAM is disposed and the temperature increase ΔT in proportion to the power consumption of the chip itself. Accordingly, for the reliable operation at a higher temperature Ta, not only the improvement of the retention characteristics but also the reduction of power consumption are indispensable.

In particular, in recent DRAMs, high density packaging of modules and their laminating technologies have been progressed. Therefore, it has become difficult to lower the thermal resistance corresponding to the temperature increase ratio per power consumption. Under such a circumstance, there is a demand for a method capable of realizing the reduction of power consumption of DRAMs and the repair of retention defect cells at the same time, without deteriorating the original speed of DRAMs and affecting their costs. By employing such a method, it becomes possible to improve the reliability of the information processor including DRAMs and others even in such an environment of high ambient temperature.

Further, even when only the repairing method is considered, the respective conventional technologies mentioned above have the following practical problems to be solved.

In the Patent document 1, in order to repair DRAM cells of inferior pose characteristics, that is, bad retention characteristics, a method for repairing defect bits distributed at random in units of bit is described. In this method, in comparison with the Patent documents 2 and 3 where the defect bits are substituted in units of logic word line, repair data for random defects can be stored in an SRAM with smaller capacity. However, since the addresses to be compared are all the addresses of row addresses and column addresses of the DRAM, there still remains a concern about increase in the time necessary for the comparison and the circuit size. In the Patent document 1, a method for comparing addresses by separating them into indexes and tags is described. However, in recent DRAMs, the number of all the addresses reaches nearly 30 bits, and further, row addresses and column addresses are inputted with a time difference. Accordingly, the method described therein still has a problem of the penalty of access time due to the comparison.

As described above, the method of the Patent document 2 has the problem that an SRAM of a large capacity for storing repair data is required because the defect bits are substituted in units of logic word line. In addition to this, the method has another problem. That is, since the DRAM chip and the exclusive chip for repair are connected to the same data bus, in the case where it is found that an access object is defective, it is necessary to set the output of the DRAM to its high impedance state to stop the same. Recent DRAMs are of high speed, and even if a command to stop the output is entered during an access operation, some initial bits of the output may be delivered. Further, some of recent specifications do not have an appropriate command to stop the output.

The Patent document 3 discloses a method where a specified area of an SRAM disposed in a DRAM is used for storing data of defect bits and a remaining area is used as a memory area. According to this method, the available address space viewed from the CPU side is the total of the memory area of the DRAM and this remaining memory area in the SRAM. However, the number of defect bits differs in each of DRAM chips. Therefore, a large area for repair in the SRAM has to be prepared in accordance with the chip with many defects, or the areas have to be changed for each of the chips. As a result, since the available address space viewed from the program of the CPU becomes small or it changes for each of the chips, it is extremely difficult to use.

The present invention has been made in consideration of such problems in the conventional technologies, and the above and other objects and novel characteristics of the present invention will be apparent from the description of this specification and the accompanying drawings.

The typical ones of the inventions disclosed in this application will be briefly described as follows.

In the present invention, to a first memory circuit with a large capacity such as a DRAM or the like which forms an information processor, a second memory circuit with a small capacity and low power consumption such as an SRAM or the like and a first controller circuit including an address comparison function are provided. Then, the second memory circuit is used for a cache of the first memory circuit and the storage of the repair data.

When an access to the first memory circuit occurs, by the address comparison function, it is checked whether the data corresponding to the address thereof has been already cached in the second memory circuit. If the data has been stored, that is, in the case of cache hit, the access is made to the second memory circuit. On the other hand, if the data has not been stored, that is, in the case of cache miss, the access is made to the first memory circuit. Further, at the time of the address comparison, it is also judged whether the cell of the first memory circuit corresponding to the address is a defect cell, and if it is a defect cell, the access is made to the repair data stored in the second memory circuit.

By this means, the access frequency to the first memory circuit decreases according to the hit rate to the cache and the operation power decreases, and the temperature increase of the first memory circuit is thus suppressed. Further, since defects at the high temperature can be repaired by the repair function, the reliability at the high temperature can be improved. More specifically, correct memory operations can be performed even at a higher ambient temperature, and it is possible to realize a highly reliable information processor. Also, in the case where a memory circuit which requires refreshing operation at a standby state such as a DRAM is used as the first memory circuit, the reduction in the standby current can be achieved owing to the improvement in the retention characteristics.

Further, since a part of the address space of the first memory circuit is allocated to the second memory circuit in an overlapped manner, even if the amount of repair data changes due to chip conditions, there is no change in the available address space viewed from the program side, which can offer good usability.

The effects obtained by typical aspects of the present invention will be briefly described below. That is, it is possible to realize a reliable information processor.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Note that, in the description below, a semiconductor memory is assumed as a memory device, and the memory device is referred to as a memory. However, the present invention is not limited to an information processor using a semiconductor memory device, but the present invention is effective also to an information processor or the like including a memory device such as a hard disk and others. Further, for simplifying the descriptions, an example where a data cache and a command cache are disposed independently as cache memories and such search methods as multi-way method, full associative method and the like are not shown. However, the present invention can be applied irrespective of such cache structures and search methods and variations in writing methods such as write back, write through and the like.

First Embodiment

Figure 1:
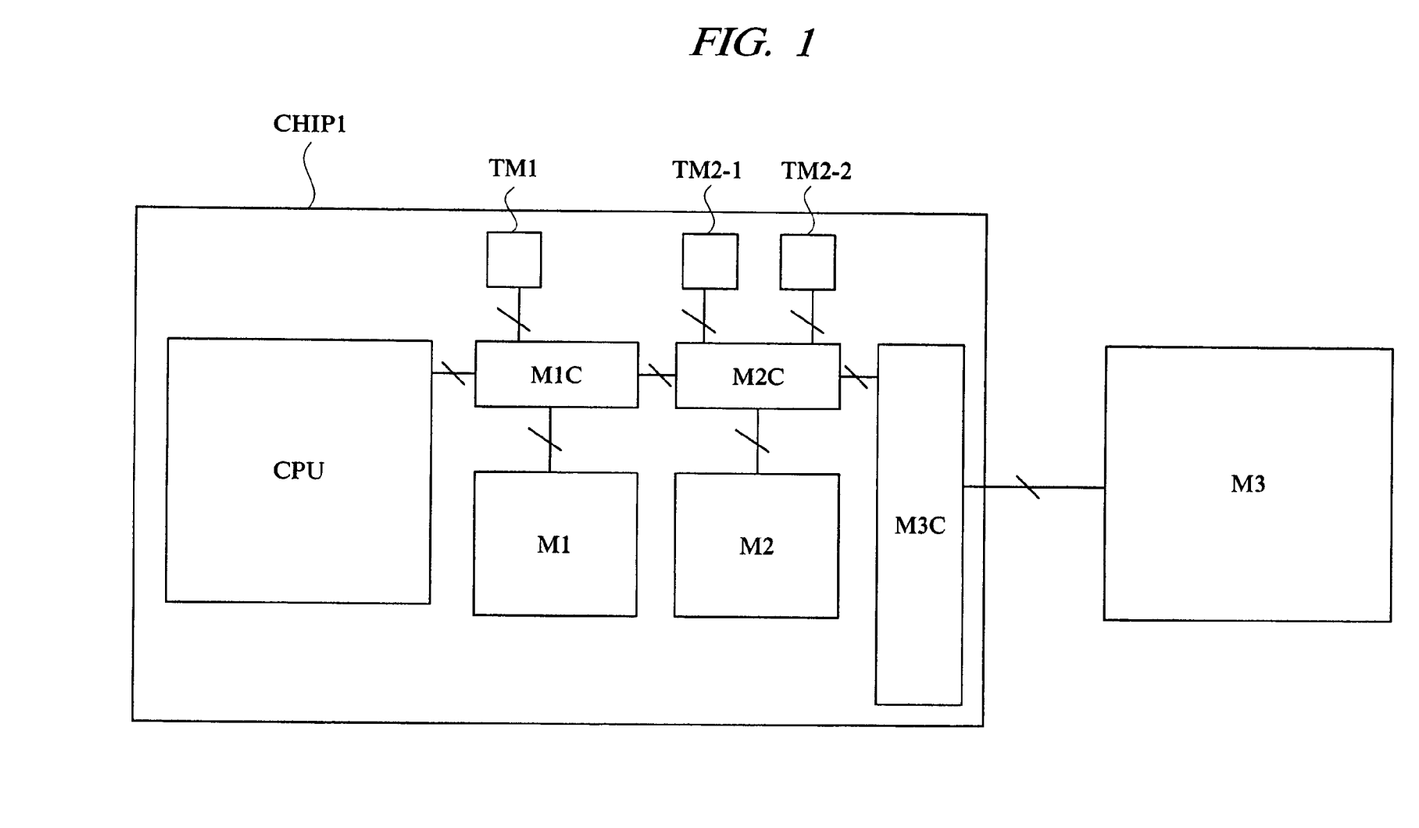
FIG. 1 is a block diagram showing an example of the structure of an information processor according to a first embodiment of the present invention.

FIG. 1 is a block diagram showing an example of the structure of an information processor according to a first embodiment of the present invention. In FIG. 1, CHIP1 is a microprocessor chip and M3 is an external memory. In the microprocessor chip CHIP1, its main structural components are shown. CPU is a central processing unit and M1, TM1 and M1C are a primary cache memory, a tag memory for the memory M1, and a primary cache controller, respectively. Further, M2 is a second memory, TM2-1 and TM2-2 are two tag memories for M2, and M2C is a second memory controller. M3C is a controller of the external memory M3. M1 and M2 operate as cache memories of the external memory M3, and M2 also stores data for repairing defect bits of M3.

As mentioned above, M2 has two tag memories, and TM2-1 is used for storing addresses of cache data stored in M2 and TM2-2 is used for storing addresses of repair data stored in M2. By providing tag memories for M2 independently for cache and for repair as described above, an effect that the allocation of respective indexes and tags can be optimized can be achieved. In other words, the allocation of the indexes and tags for cache to addresses from the CPU is optimized for convenience of the CPU. However, all defect bits cannot be repaired by the limited capacity of M2 unless the allocation of the indexes and tags for repair is determined based on the distribution of defect bits peculiar to M3. Accordingly, by optimizing them independently, it is possible to attain both the improvement of hit rate of cache and the increase of the number of repair bits.

Further, in the present embodiment, repair data is stored in the cache memory. Therefore, different from the Patent document 3, the memory space which a program can use does not change due to an increase or decrease of repair data of each chip, which can offer good usability. Furthermore, by the hits of the repair data and the cache data stored in the second memory M2, the power consumption of the external memory M3 itself decreases. By this means, the heat generation amount of the external memory M3 decreases, and the reliability especially in the case of high ambient temperature is improved. Moreover, since M2 is disposed in the microprocessor chip, the power consumption at the time of an access to M2 is smaller than that at the time of an access to the external memory M3. Accordingly, by the hit to the secondary cache, the power consumption of the entire information processor can be reduced. Furthermore, different from the Patent document 2, the memory for storing repair data and the memory to be repaired are not connected to the same data bus, and M3 is accessed via the controller M3C. Therefore, in the case where an access object is a defect bit of M3, the operation of M3 can be cancelled easily by stopping the issue of the access command from M3C, which is an advantage of the present embodiment.

Figure 2:
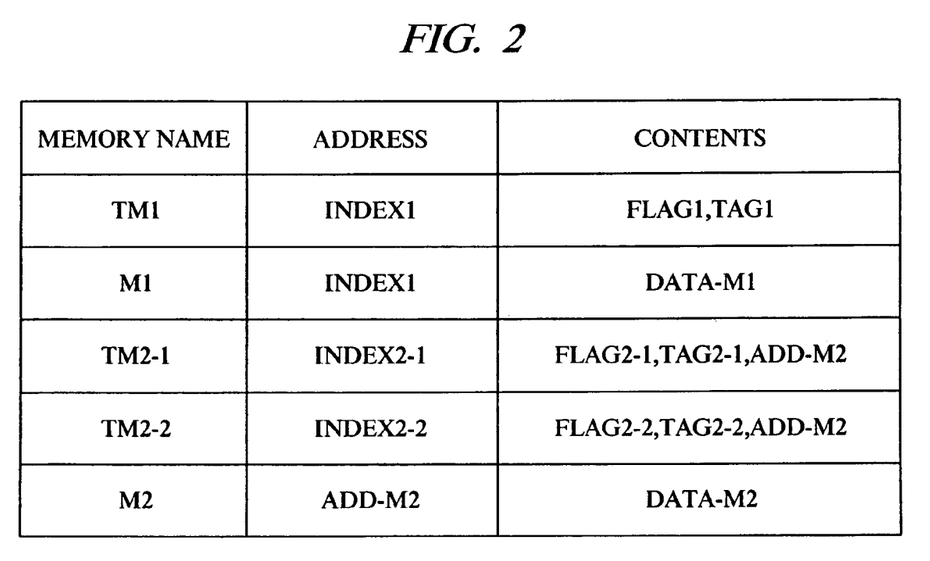
FIG. 2 is an explanatory diagram showing an example of specifications of respective memories in the information processor in FIG. 1.

Next, the operation in the structure example of FIG. 1 will be described with reference to FIG. 2 and FIG. 3. FIG. 2 is a table showing addresses to be inputted to respective memories in the microprocessor chip CHIP1 in FIG. 1 and contents which the respective memories store. An index INDEX1 is inputted to the tag memory TM1 as an address. Also, the contents of the memory area of TM1 designated by one INDEX1 are a flag FLAG1 showing whether the stored tag is valid or not and a tag TAG1. INDEX1 and TAG1 use a part of addresses issued from the CPU as in a cache memory of normal set associative method. More specifically, among addresses from the CPU, except the portion corresponding to the line size of cache, the number of bits determined by the number of entries of the primary cache memory M1 is allocated to INDEX1 and the rest is allocated to TAG1. Usually, addresses from the CPU are allocated to line, index, and tag in the order of low-order address.

The above-described INDEX1 is given to the primary cache memory M1 as an address. Then, in the area of M1 designated by INDEX1, cached data DATA-M1 is stored.

INDEX2-1 is given to the tag memory TM2-1 as an address. Also, the contents of the memory area of TM2-1 designated by one INDEX2-1 are flag FLAG2-1, tag TAG2-1 and an address (pointing address) ADD-M2 of the memory M2 where corresponding cache data is stored. In this case, FLAG2-1 shows whether the stored TAG2-1 is valid or not. INDEX2-1 and TAG2-1 are allocated by using a part of the addresses given from the primary cache controller M1C. The addresses given from M1C are logic addresses from CPU or physical addresses converted therefrom depending on the structures of microprocessor. At this time, similar to the case of the primary cache described above, the number of bits of INDEX2-1 and TAG2-1 is determined by the number of entries and the line size of the memory M2. The difference from the case of TM1 lies in that address ADD-M2 of the corresponding M2 is stored in the tag memory TM2-1 in addition to flag and tag.

INDEX2-2 is given to the tag memory TM2-2 as an address. Also, the contents of the memory area of TM2-2 designated by one INDEX2-2 are flag FLAG2-2, tag TAG2-2 and address (pointing address) ADD-M2 of the memory M2 where corresponding repair data is stored. In this case, FLAG2-2 shows whether the stored TAG2-2 is valid or not. Similar to INDEX2-1 and TAG2-1 mentioned above, INDEX2-2 and TAG2-2 are allocated by using a part of the addresses given from the primary cache controller M1C.

ADD-M2 stored in TM2-1 or TM2-2 is given to the memory M2 as an address. Also, in the area designated by one ADD-M2, DATA-M2 which is cache data or repair data is stored.

As described above, the present embodiment is characterized in that two tag memories of the memory M2 are disposed and the address management of M2 is performed independently in each of the tag memories. By this means, the allocation of index and tag optimal for storing cache data can be achieved in TM2-1, and the allocation of index and tag in accordance with the distribution of defect bits of the external memory M3 to be used can be achieved in TM2-2. Note that the distribution of defect bits can be calculated from test results at the manufacture of M3. Alternatively, in the information processor shown in FIG. 1, for example, by performing the test for M3 by the microprocessor chip CHIP1 at the moment of power supply, results thereof can be used as the distribution of defect bits. In the latter case, there is an advantage that detects which occur with elapse of time can be treated.

Next, the entire operation of the information processor in FIG. 1 provided with the respective memories in FIG. 2 will be described. As described above, in the structure example in FIG. 1, the primary cache memory M1 and the memory M2 which operates as the secondary cache memory and repair data memory are disposed. Addresses to the respective memories M1 and M2 are compared with addresses stored in tag memories, and it is judged whether object data is stored in M1 and M2 or not, that is, the hit or the miss is judged. FIG. 3 is an explanatory diagram of the operation in FIG. 1 classified into cases according to the above comparison results.

Figure 3:
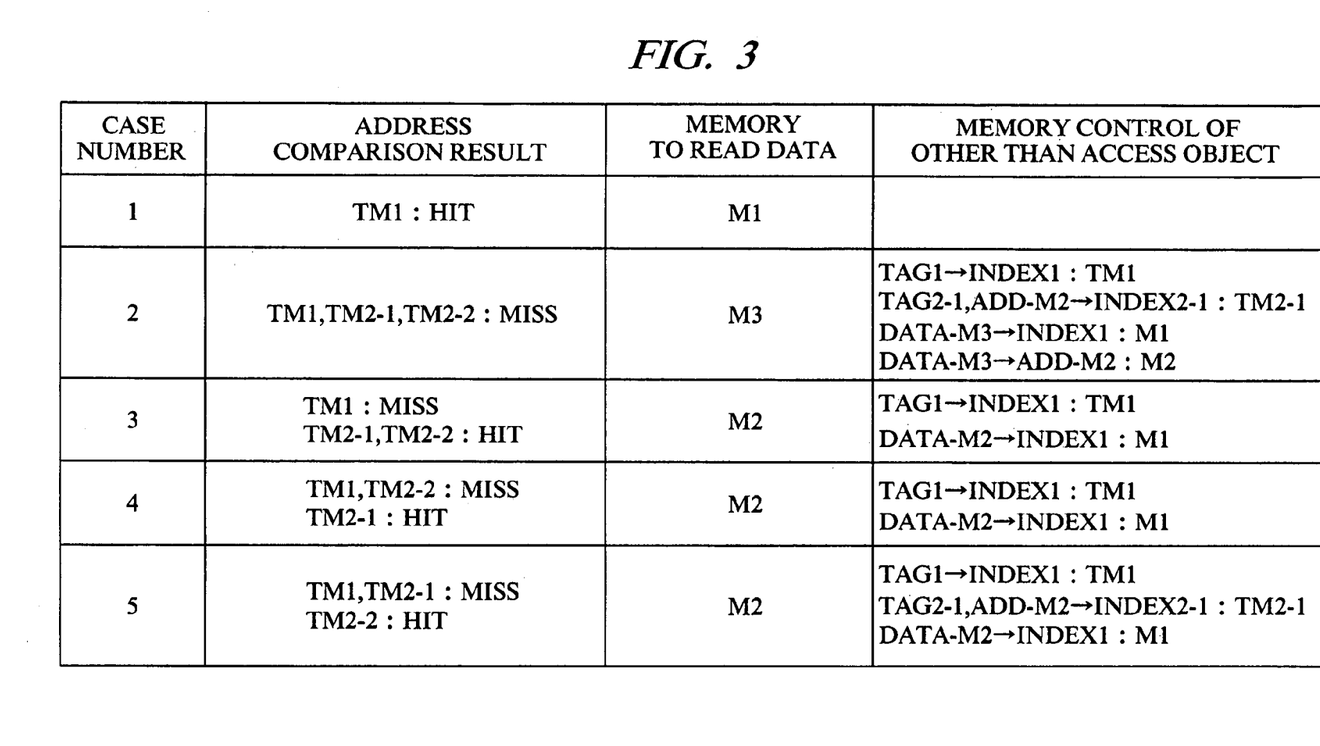
FIG. 3 is an explanatory diagram showing an example of the operation in the information processor in FIG. 1.

Before the description of the contents, explanatory remarks are made for the descriptions in the fourth column in FIG. 3. For example, the description "TAG2-1, ADD-M2→INDEX2-1: TM2-1" means "writing TAG2-1 and ADD-M2 into the address INDEX2-1 of the tag memory TM2-1".

In FIG. 3, case 1 corresponds to the case of a hit to TM1. That is, index and tag are generated from the address given from the CPU, and the index INDEX1 is given to TM1 as an address. The flag FLAG1 thus read out is valid, and the read TAG1 and the tag generated from the address from the CPU are matched. In this case, data is read from the primary cache M1 by use of the address INDEX1. Note that, in the following cases, descriptions are made on the assumption that the flag is valid in the case of hit.

Case 2 corresponds to the case where the tag read in any of TM1, TM2-1 and TM2-2 do not match the generated tag. In other words, this is the case of misses in all. In this case, the primary cache and the secondary cache are not hit, and it is not the area including defect bits in M3. Accordingly, the external memory M3 is accessed via the M3 controller M3C. At this time, in order to store the data read from M3 into M1 and M2 as cache data, the operation shown in the third row of the fourth column is carried out. First, as an update of the tag memory, TAG1 is written into the tag memory TM1 with using INDEX1 as an address. Further, TAG2-1 and ADD-M2 which is the address of the data storage place in M2 are written into the tag memory TM2-1 with using INDEX2-1 as an address. Further, data of M1 and M2 are also updated. More specifically, data DATA-M3 read from M3 is written into M1 with using INDEX1 as an address, and this data DATA-M3 is written also into M2 with using ADD-M2 as an address.

Case 3 corresponds to the case of a miss in TM1 and hits in TM2-1 and TM2-2. This is the case of a miss in the primary cache and a hit in the secondary cache, and defect bits are included in the area of the corresponding M3. In this case, data DATA-M2 obtained by the access to the memory M2 by using the address ADD-M2 read from TM2-1 is used as data. Also, the tag and data of the primary cache are updated as shown below. That is, the tag TAG1 is written into TM1 with using INDEX1 as an address, and data DATA-M2 is written into the memory M1 with using INDEX1 as an address.

Case 4 corresponds to the case of a miss in TM1, a hit in TM2-1, and a miss in TM2-2. In this case, since the secondary cache is hit, data is read by accessing M2 with using the address ADD-M2 read from TM2-1. Further, the tag and data of the primary cache are updated. That is, TAG1 is written into TM1 with using INDEX1 as an address, and the data DATA-M2 is written into M1 with using INDEX1 as an address.

Case 5 corresponds to the case of misses in TM1 and TM2-1 and a hit in TM2-2. That is, this is the case of misses in both the primary cache and the secondary cache, but defect bits of M3 are included in the access object. In this case, data is read by accessing M2 with using ADD-M2 read from TM2-2 as an address. Further, the tag and data of the primary cache and the tag of the secondary cache are updated. That is, TAG1 is written into TM1 with using INDEX1 as an address, and TAG2-1 and ADD-M2 are written into TM2-1 with using INDEX2-1 as an address. Further, the data DATA-M2 read from M2 is written into M1 with using INDEX1 as an address.

In the case 5, as ADD-M2 to be written into TM2-1, one read from TM2-2 is used. By this means, addresses of the object data in M2 can be matched in TM2-1 and TM2-2. As a result, it is possible to independently optimize the allocation of index and tag by the two tag memories TM2-1 and TM2-2 provided for one memory M2. Further, TM2-1 corresponding to the same memory M2 as TM2-2 is updated in order to increase the access speed to this address in subsequent cache hits because the CPU side recognizes the case of the TM2-1 hit as a hit of the secondary cache.

In this case, although the secondary cache (i.e., TM2-1) is not hit, data is actually read from the memory M2. Therefore, the reading in shorter time than the access time in the case of the reading from M3 is possible. However, in the case of a miss of the secondary cache viewed from the CPU side, the control may become easier if data is read in accordance with the access time of M3. In such a case, preferably, data is read while adjusting time by the controller M2C as if it is an access from M3. Further, if greater emphasis is placed on the power reduction by the reduction in access frequency to the external memory than the high-speed operation by the secondary cache function, when data is read from M2, even the cache data can be read slowly in accordance with the access time of M3.

Figure 4:
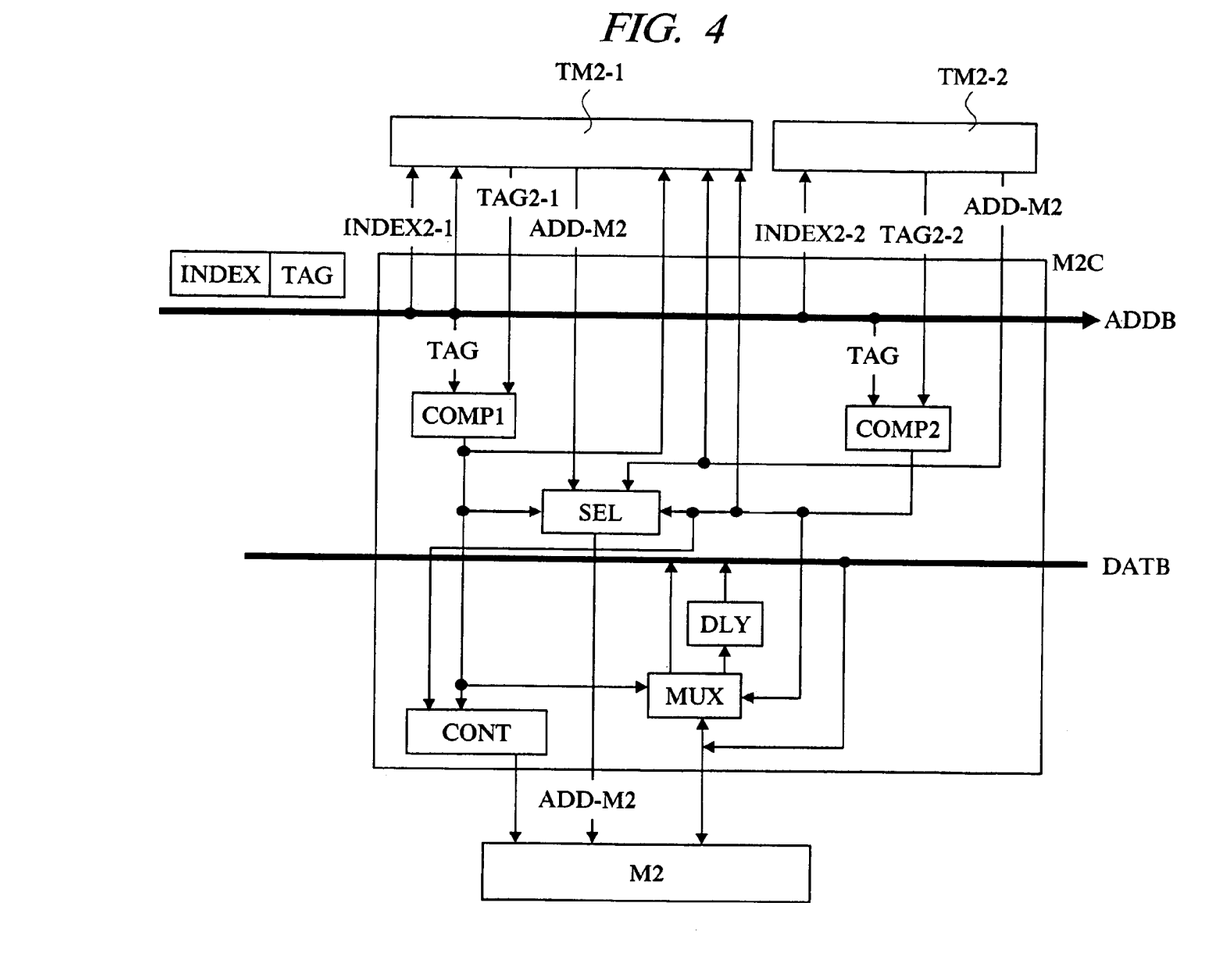
FIG. 4 is a block diagram showing a structure example of a second memory controller in the information processor in FIG. 1.

FIG. 4 is a block diagram showing a structure example of the second memory controller M2C in FIG. 1. M2C is composed of, for example, two comparison circuits COMP1 and COMP2 corresponding to TM2-1 and TM2-2 respectively, a selector circuit SEL which selects addresses to M2 according to this comparison result, a control circuit CONT which generates control signals to M2, a multiplexer MUX and a delay circuit DLY which adjust the output data from M2, and others. The COMP1 compares TAG2-1 outputted from TM2-1 and the tag for TM2-1 given via the address bus ADDB from the primary cache controller M1C in FIG. 1, and it outputs a match signal when they are matched and outputs a mismatch signal when they are mismatched. The COMP 2 compares TAG2-2 outputted from TM2-2 and the tag for TM2-2 given via the address bus ADDB from the M1C, and it outputs a match signal when they are matched and outputs a mismatch signal when they are mismatched.

The selector circuit SEL outputs the address ADD-M2 read from TM2-1 to the memory M2 when the comparison result of COMP1/COMP2 is match/match or match/mismatch, and it outputs ADD-M2 read from TM2-2 to the memory M2 when the comparison result thereof is mismatch/match. Further, when the comparison result of COMP1/COMP2 is mismatch/mismatch, in order to update the secondary cache formed of TM2-1 and the memory M2, ADD-M2 read from TM2-1 is outputted to M2. When the comparison result of COMP1/COMP2 is match/match, match/mismatch, and mismatch/match, since the secondary cache and/or repair are hit, the control circuit CONT outputs a Read signal to M2. On the other hand, when the comparison result of COMP1/COMP2 is mismatch/mismatch, in order to update the secondary cache, it outputs a Write signal to M2.

The multiplexer MUX receives the result of the comparison circuits COMP1 and COMP2 and selects whether to output the output data DATA-M2 from M2 directly to the data bus DATB or to output the same via the delay circuit DLY to the data bus DATB. When the comparison result of COMP1/COMP2 is match/match or match/mismatch, since the secondary cache is hit, it outputs DATA-M2 directly to the data bus DATB. On the other hand, when the comparison result of COMP1/COMP2 is mismatch/match, since only repair is hit, in order to pretend as an access from M3 in a pseudo manner as mentioned previously, it outputs DATA-M2 via the delay circuit DLY to the data bus DATB. Note that, when the comparison result of COMP1/COMP2 is mismatch/mismatch, it is necessary to input data from the data bus DATB in a reverse manner. Accordingly, in the case of MUX in FIG. 4, it functions so as to shut the output path from M2 to the data bus DATB.

Next, the operation of the structure example in FIG. 4 will be described. First, TM2-1 takes in the index INDEX2-1 given via the address bus ADDB and outputs corresponding tag TAG2-1 and address ADD-M2. COMP1 compares the tag TAG for TM2-1 given via ADDB and TAG2-1. Similarly, TM2-2 takes in the index INDEX2-2 given via the address bus ADDB and outputs corresponding tag TAG2-2 and address ADD-M2. COMP2 compares the tag TAG for TM2-2 given via ADDB and TAG2-2. Subsequently, according to the four types of comparison results by COMP1 and COMP2, the following operations are carried out.

[1] Case where comparison result of COMP1/COMP2 is match/match (secondary cache hit, repair hit)

The selection circuit SEL selects ADD-M2 outputted from TM2-1 and outputs it to M2. The control circuit CONT outputs the Read signal to M2. By this means, the data DATA-M2 outputted from M2 is outputted directly to the data bus DATB through the selection in the multiplexer MUX. Note that, although the SEL selects ADD-M2 outputted from TM2-1, it can select ADD-M2 outputted from TM2-2, too.

[2] Case where comparison result of COMP1/COMP2 is match/mismatch (secondary cache hit, repair miss)

The SEL selects ADD-M2 outputted from TM2-1 and outputs it to M2. The CONT outputs the Read signal to M2. By this means, the data DATA-M2 outputted from M2 is outputted directly to the data bus DATB through the selection in the multiplexer MUX.

[3] Case where comparison result of COMP1/COMP2 is mismatch/match (secondary cache miss, repair hit)

The SEL selects ADD-M2 outputted from TM2-2 and outputs it to M2. The CONT outputs the Read signal to M2. By this means, the data DATA-M2 outputted from M2 is outputted to the data bus DATB via the delay circuit DLY through the selection in the multiplexer MUX. On the other hand, TM2-1 receives a mismatch signal from COMP1 and a match signal from COMP2. Upon receiving them, TM2-1 replaces the TAG2-1 stored in the index INDEX2-1 with the tag TAG for TM2-1 transmitted via ADDB. Further, TM2-1 replaces ADD-M2 stored in INDEX2-1 with ADD-M2 outputted from TM2-2.

[4] Case where comparison result of COMP1/COMP2 is mismatch/mismatch (secondary cache miss, repair miss)

The SEL selects ADD-M2 outputted from TM2-1 and outputs it to M2. The CONT outputs the Write signal to M2. M2 receives data to be written into this ADD-M2 from the data bus DATB and carries out a write operation. Further, TM2-1 receives a mismatch signal from COMP1 and a mismatch signal from COMP2. Upon receiving them, TM2-1 replaces the TAG2-1 stored in the index INDEX2-1 with the tag TAG for TM2-1 transmitted via ADDB.

By the structure and operation of the second memory controller M2C as mentioned above, it is possible to realize the control of the second memory M2 having both the function of the secondary cache and the function of repair data memory. Note that, in FIG. 4, the example where the output data is delayed by the delay circuit DLY when only repair is hit has been shown. Alternatively, the output data can be delayed by delaying the Read signal from the control circuit CONT.

Further, in the description above, the read operation is taken as the example. However, also in the write operation, for example, in the case of the write through method, writing can be simultaneously made to M1, M2 and M3 irrespective of the address comparison results. Therefore, the control of writing can be easily performed. In this case, when TAG2-2 is hit, although there are defect bits in the object area of M3, since it is not used in the reading, writing can be performed to M3 without any regard. Alternatively, depending on the types of defects, if there is such a failure that excessively large current flows when an access is made, the access to M3 is avoided. In the case of adopting a write back method, by providing a flag showing that the cached data is dirty in the same manner as a normal cache system, the structure examples described above can be easily applied.

Furthermore, descriptions have been made based on the example where the second memory M2 has a function of the secondary cache and a function to store repair data. However, the present invention is not limited to the function of the secondary cache, but other memory can have the function of other order cache. For example, when the cache function and repair function are provided to the primary cache (first memory M1), since the primary cache has a small capacity in general and high-speed performance equivalent to that of CPU is required therein, from this viewpoint, it is preferable to provide them to the secondary (second memory M2) and latter caches. Further, when the capacity of the primary cache changes due to the repair function, it may cause great influences to the hit rate of the entire system. Meanwhile, when they are provided to the secondary and latter caches, since there is not such a significant influence to the hit rate even if the capacity changes to some extent, it is possible to improve the reliability while maintaining the high-speed performance of the system.

Second Embodiment

In the first embodiment mentioned above, an example of an information processor including microprocessor chips having external memory controllers has been shown. Such an information processor has a structure especially suitable for so-called mobile devices such as a cellular phone and the like. In a second embodiment, an example of an information processor suitable for a personal computer and a work station and others will be described.

Figure 5:
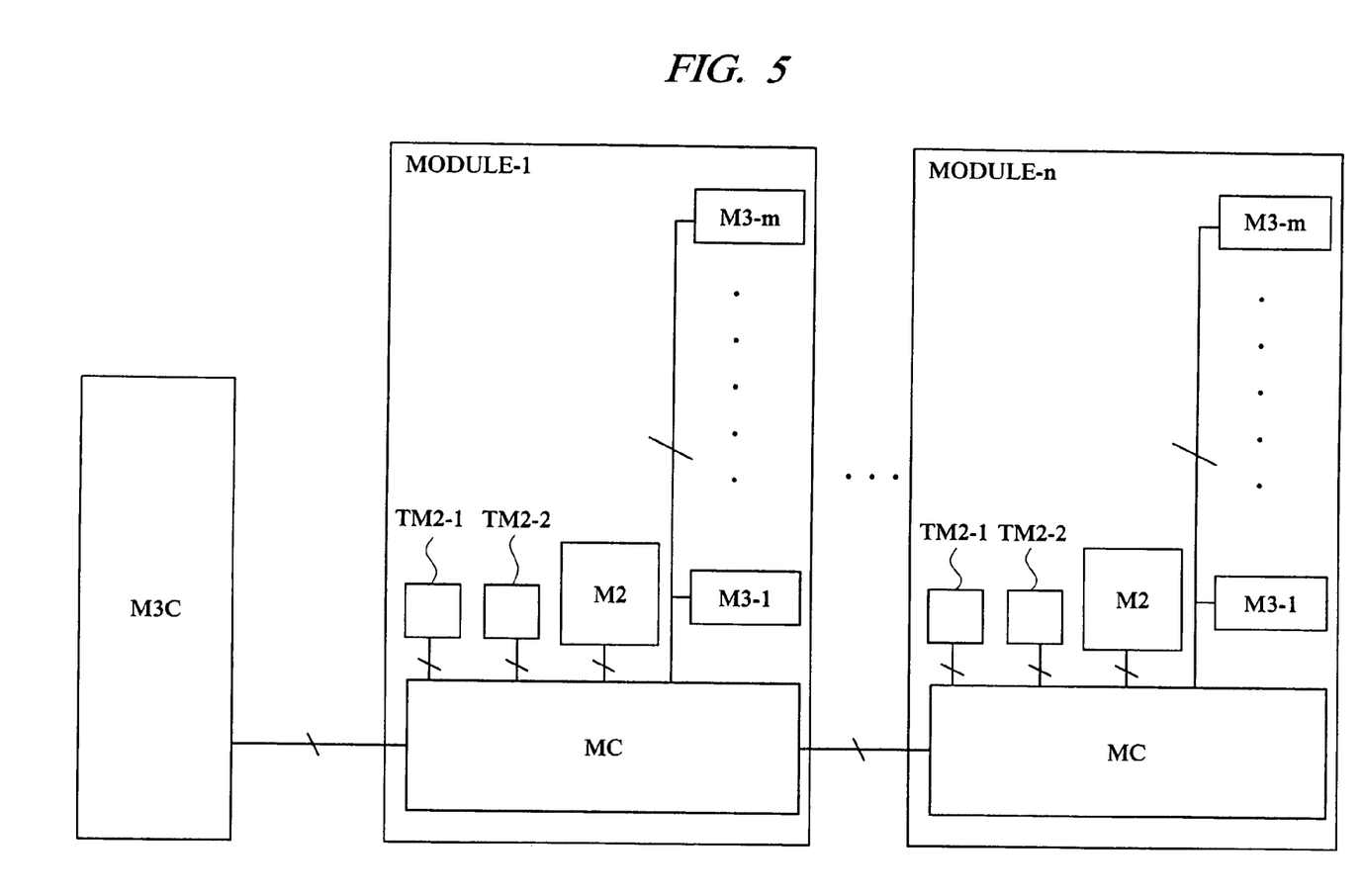
FIG. 5 is a block diagram showing an example of the structure of an information processor according to a second embodiment of the present invention.

FIG. 5 is a block diagram showing an example of the structure of an information processor according to the second embodiment of the present invention. In FIG. 5, MODULE-1 to MODULE-n are memory modules having a plurality of memories M3, a memory M2 having a function of a cache memory and a function to store repair data, and others. In the following descriptions, a dynamic memory DRAM is assumed as the memory M3. However, the present embodiment is not limited to this. These memory modules are controlled by commands and addresses from a memory controller M3C. Addresses and commands and input/output data are once buffered by a module controller MC in the memory module and then transmitted between MCs in adjacent memory modules. According to this structure example, memory modules are connected in serial, and commands, addresses and input/output data are buffered by the MC in each module. Therefore, there is a small influence of noises due to signal transmission and operations can be made in synchronization with a high-speed clock.

Further, the MC compares inputted addresses with addresses stored in the tag memories TM2-1 and TM2-2 and accesses M2 or M3 on the basis of the comparison results. The access destinations depending on match/mismatch of addresses and the method for updating the memory contents are the same as those described above with reference to FIG. 3. Note that M2 is used as the secondary cache memory in FIG. 3, but a secondary or tertiary cache is already disposed on a processor side in personal computers and work stations and others in many cases. In such a case, the memory is used as a next order cache of the existing caches. In this case, it is needless to mention that M1 in FIG. 3 is used as the highest order cache among the existing caches.

In the present embodiment, M2 is disposed in the memory module. In this case, if compatibility with the conventional memory module can be achieved, it becomes easy to apply this memory module to the existing information processors. For its achievement, in both the cases where a cache is hit and repair data is hit in the access to the memory M2, the control is made by MC in accordance with the access speed of M3. Further, in the structure shown in FIG. 5, M2 and M3 are mounted in the memory module. In this case, for example, M2, TM2-1, TM2-2, and MC are integrated on one semiconductor chip and the semiconductor chip is mounted together with m pieces of M3 chips on a module board. Alternatively, by use of chip lamination technology, a plurality of M3 chips and a chip on which M2, TM2-1, TM2-2, and MC are integrated are contained in one package, and a plurality of such packages and M3C are mounted on one module board. In this manner, various structures are possible.

By use of the structure mentioned above, the heat generation of chips is restrained owing to the power reduction by the cache effects, and further, defects at high temperature can be repaired by the repair. Accordingly, even if such high-density mounting as mentioned above is carried out, it is possible to realize a highly reliable information processor. Furthermore, different from the Patent document 2, the memory to store repair data and the memory of repair object are not connected to the same data bus and M2 and M3 are accessed via the controller MC. Therefore, in the case where an access object is a defect bit of M3, the operation of M3 can be cancelled easily by stopping the issue of the access command from M3C. Moreover, in the structure example in FIG. 5, the memory M2, TM2-1 and TM2-2 are disposed in the memory module. By this means, it is possible to ship the modules in which test results of the memory M3 performed at the time of its production are stored in TM2-2 formed of a nonvolatile memory and a nonvolatile memory separately disposed on the module in advance.

Incidentally, in FIG. 5, the address sent from M3C to M2 has a structure and timing in accordance with the specifications of the memory M3. When a DRAM or the like is used as the memory M3, row addresses and column addresses are inputted with a time difference in some case. In such a case, it is preferable that the tag memories TM2-1 and TM2-2 of M2 are separated into the area for row addresses and the area for column addresses, respectively. By separating them, the address comparison can be started at the time when a row address is inputted. Therefore, in comparison with the case where the address comparison is performed after a column address is inputted, the structure is advantageous in terms of speed and circuit scale. One example of an information processor suitable for such a case will be described with reference to FIG. 6.

Figure 6:
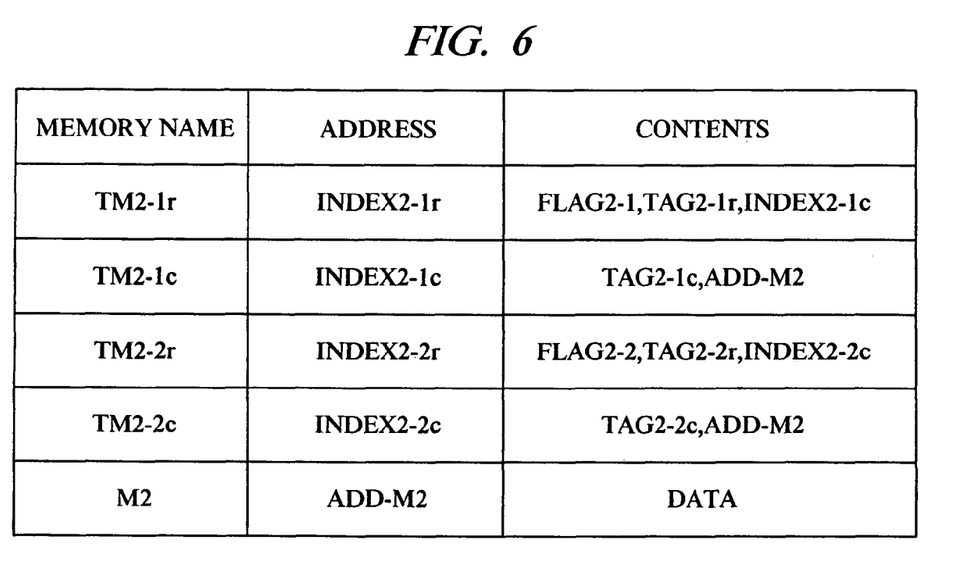
FIG. 6 is an explanatory diagram showing an example of specifications of respective memories in the case where the tag memories are further separated in the information processor in FIG. 5.

FIG. 6 is an explanatory diagram showing an example of specifications of respective memories in the case where the respective tag memories in the information processor in FIG. 5 are further separated. In FIG. 6, TM2-1*r*, TM2-1*c*, TM2-2*r*, and TM2-2*c* are a tag memory for cache for row address comparison, a tag memory for cache for column address comparison, a tag memory for repair for row address comparison, and a tag memory for repair for column address comparison, respectively.

In the tag memory TM2-1*r*, an index INDEX2-1*r* for row address is inputted from the module controller MC. As a result, the contents to be read are a flag FLAG2-1 which shows whether the stored tag is valid or not, a tag TAG2-1*r* generated from row address, and an index INDEX2-1*c* for column address. In TM2-1*c*, the index INDEX2-1*c* read from TM2-1*r* is inputted as an address, and the contents to be read are the tag TAG2-1*c* and an address (pointing address) ADD-M2 in the memory M2. On the other hand, in the tag memory TM2-2*r* for repair, an index INDEX2-2*r* for row address is inputted from the module controller MC, and the contents to be read are a flag FLAG2-2, TAG2-2*r* and INDEX2-2*c*. Further, in the tag memory TM2-2*c*, the index INDEX2-2*c* read from TM2-2*r* is inputted as an address, and the contents to be read are TAG2-2*c* and ADD-M2. In M2, ADD-M2 read from TM2-1*c* or TM2-2*c* is inputted as an address, and the data DATA to be read is the data for cache or repair.

The outline of the operation will be described below. Since the operation in the tag memory for cache and that in the tag memory for repair are the same, only the operation of the tag memory for cache will be described. First, a row address is issued from M3C. Then, in the MC of the relevant module, from the received row address, indexes and tags for cache and repair are generated in accordance with a preset allocation. Then, TM2-1*r* is accessed with using the generated INDEX2-1*r* as an address and the contents thereof are read. As a result, if the flag is valid and the read tag TAG2-1*r* matches the tag generated by MC, TM2-1*c* is accessed with using the read INDEX2-1*c* as an address, and the contents thereof are read in advance.

Subsequently, when a column address is issued from M3C, MC generates indexes and tags in the same manner as in the case of row address. Then, it is checked whether the generated index matches INDEX2-1*c* read from TM2-1*r* in advance. Further, it is checked whether TAG2-1*c* read from TM2-1*c* matches the tag generated by MC. If both the index INDEX2-1*c* and the tag TAG2-1*c* match, it means cache is hit. In this case, the memory M2 is accessed with using ADD-M2 read from TM2-1*c* in advance simultaneously with the tag as an address, and the data thereof is read. Alternatively, according to timing, data is read from the memory M2 in advance with using ADD-M2 as an address, and in the case where cache is hit, the data read in advance can be treated as valid data.

In the above, in order to perform a high-speed comparison, it is effective to use memories with high access speed such as SRAM and others for M2. When the number of bits of index is defined as "in", the capacity of M2 is equivalent to the in-th power of 2. Therefore, it can be reduced by the number of bits of tag in comparison to the address space of the memory M3. Accordingly, even if M2 is formed of SRAMs, an influence of the increase in area is small. Further, in the structure example in FIG. 5, by connecting modules or the module and M3C with a bus having a width smaller than that in the module, the data transmission outside the module can be performed in synchronization with a higher-speed clock than that in the module. In this case, if M2 and the tag memory of M2 in addition to MC are operated by a high-speed clock, it is effective for carrying out the comparison at high speed. By this means, the performances are not deteriorated even in the case where a DRAM with small latency is used as M3 in FIG. 5.

Main effects in the case of using the information processors according to the first and second embodiments are summarized as follows.

(1) Since the tag memory for cache and the tag memory for repair to control M2 are disposed, it is possible to independently optimize the allocation of indexes and tags.

(2) As a result, the temperature increase of the first memory device is restrained in accordance with the hit rate of cache, and it is possible to efficiently repair defect bits expressing different distributions among chips.

(3) Accordingly, it is possible to increase the reliability of information processors even under conditions of high ambient temperature.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments mentioned above, the normal cache function is provided in M2. However, other than the normal cache function, for example, victim cache function and repair data storage can be provided in M2. The victim cache herein is the function where data ejected from a low order cache is temporarily stored so as to make it unnecessary to access the main memory when access is made to the ejected data. This function can be realized easily in the case of the structure example in FIG. 1 as well as in the case of the structure example in FIG. 5. Especially, in the case where secondary and tertiary caches have been already disposed separately, the improvement of hit rate as cache is difficult in some cases, and the function is suitable for such a case. Note that the victim cache is different from the normal cache in that data ejected from a low order cache is written. Therefore, it is necessary to inform that the write data sent to, for example, M2C in FIG. 1 is the data ejected from a low order cache. For this purpose, it is needless to mention that an exclusive signal line may be provided or an exclusive command may be defined by use of a normal signal line.

Further, in the embodiments above, M2 is used for storing the repair data of the memory M3, but there is a case where M2 itself must be repaired depending on the capacity of M2. In such a case, it is needless to mention that spare bits are disposed in M2 itself to repair the same. Furthermore, in the case where an SRAM is used as M2 and a DRAM is used as M3, since the SRAM has more software errors than the DRAM, measures thereto have to be taken. In such a case, it is preferable to provide an error correction circuit such as a so-called ECC in the SRAM. By providing the ECC to the information of physically distant cells, strong measures to the multi-bit errors can be taken.

The information processor according to the present invention is particularly effective when applied to a system including semiconductor memories such as DRAMs and a CPU. Besides, it can be widely applied to systems including various memory devices, for example, to a system including memory devices such as hard disks and others.

What is claimed is:

1. An information processor comprising:
a first memory circuit;
a second memory circuit whose memory capacity is smaller than that of the first memory circuit;
an address memory circuit; and
a first controller circuit, wherein the address memory circuit stores a first address group and a second address group which are addresses of the first memory circuit and a plurality of pointing addresses which are addresses of the second memory circuit and are provided in accordance with a plurality of addresses included in the first address group and the second address group, wherein the first controller circuit accesses the second memory circuit by use of a corresponding pointing address among the plurality of pointing addresses when an input address for accessing the first memory circuit is included in one or both of the first address group and the second address group, wherein the first address group is formed of cache addresses to the first memory circuit, and wherein the second address group is formed of addresses for defect repair which repair addresses of defects of the first memory circuit.

2. The information processor according to claim 1, wherein each of the plurality of addresses included in the first address group is formed of a first index address and a first tag address, wherein each of the plurality of addresses included in the second address group is formed of a second index address and a second tag address, wherein the address memory circuit is formed of
   a first address memory circuit which stores the first tag address and a first pointing address corresponding to the first tag address in the first index address; and
   a second address memory circuit which stores the second tag address and a second pointing address corresponding to the second tag address in the second index address, and wherein the first controller circuit includes
   a first comparison function which extracts the first index address from the input address to access the first address memory circuit and compares the first tag address obtained by the access and a first input tag address extracted from the input address;
   a second comparison function which extracts the second index address from the input address to access the second address memory circuit and compares the second tag address obtained by the access and a second input tag address extracted from the input address; and
   a selection function which selects the first pointing address or the second pointing address according to results of the first and second comparison functions and outputs the selected pointing address to the second memory circuit.

3. The information processor according to claim 2, wherein, in the first index address and the second index address, bits of the respectively corresponding input addresses are different.

4. The information processor according to claim 1, wherein the first memory circuit is a DRAM, and the second memory circuit is an SRAM.

5. The information processor according to claim 1, wherein the information processor further comprises: an information processing unit which performs various information processes by use of data of the first memory circuit; and a second controller circuit which performs an access control to the first memory circuit in the case where the input address is not included in both of the first address group and the second address group in the first controller circuit, the information processing unit is connected via the first controller circuit and the second controller circuit to the first memory circuit, and the address memory circuit and the second memory circuit are connected to the first controller circuit.

6. The information processor according to claim 5, wherein the information processing unit, the first and second controller circuits, the address memory circuit, and the second memory circuit are formed on a semiconductor board.

7. The information processor according to claim 1, wherein the first controller circuit has a function to delay a timing of read access of the second memory circuit to the same level of a timing of read access of the first memory circuit when the input address for accessing the first memory circuit is included only in the second address group.

8. The information processor according to claim 1, wherein the first address group is formed of secondary and latter cache addresses to the first memory circuit.

9. An information processor comprising:

memory modules in which a plurality of first memory chips, a second memory circuit, an address memory circuit, and a module controller circuit are mounted, wherein the address memory circuit stores a first address group and a second address group which are addresses of the plurality of first memory chips and a plurality of pointing addresses which are addresses of the second memory circuit and are provided in accordance with a plurality of addresses included in the first address group and the second address group, wherein the module controller circuit has a buffer function for signals sent to and received from the plurality of first memory chips and a function to access the second memory circuit by use of a corresponding pointing address among the plurality of pointing addresses when the input address for accessing the plurality of first memory chips is included in one or both of the first address group and the second address group, wherein each of the plurality of first memory chips is a DRAM chip, wherein the first address group is formed of cache addresses to the plurality of first memory chips, and wherein the second address group is formed of addresses for defect repair for repairing addresses of defects of the plurality of first memory chips.

10. The information processor according to claim 9, wherein each of the plurality of addresses included in the first address group is formed of a first row index address, a first row tag address, a first column index address, and a first column tag address, wherein the address memory circuit includes
   a first row address memory circuit which stores the first row tag address and the first column index address in the first row index address; and
   a first column address memory circuit which stores the first column tag address and a first pointing address corresponding to the first column tag address in the first column index address, and wherein the module controller circuit includes
   a first comparison function to extract the first row index address from an input row address serving as one of the input addresses to access the first row address memory circuit and compare the first row tag address obtained by the access and a first input row tag address extracted from the input row address;

second comparison function to compare a first input column index address extracted from an input column address serving as the other of the input addresses and the first column index address obtained by the access to the first row address memory circuit; and
a third comparison function to compare the first column tag address obtained by accessing the first column address memory circuit by the first column index address and a first input column tag address extracted from the input column address.

11. The information processor according to claim 9,
wherein the module controller circuit has a function to delay a timing of read access of the second memory circuit to the same level of a timing of read access of the plurality of first memory chips when the input address for accessing the plurality of first memory chips is included only in the second address group.

* * * * *